United States Patent
Brox et al.

(10) Patent No.: US 7,482,849 B2
(45) Date of Patent: Jan. 27, 2009

(54) CLOCK SIGNAL SYNCHRONIZING DEVICE, AND CLOCK SIGNAL SYNCHRONIZING METHOD

(75) Inventors: Martin Brox, München (DE); Alessandro Minzoni, Xi'an (CN)

(73) Assignee: Infineon Technologies AG, Munich (DE)

( * ) Notice: Subject to any disclaimer, the term of this patent is extended or adjusted under 35 U.S.C. 154(b) by 381 days.

(21) Appl. No.: 11/211,084

(22) Filed: Aug. 25, 2005

(65) Prior Publication Data

US 2007/0182468 A1    Aug. 9, 2007

(30) Foreign Application Priority Data

Aug. 30, 2004    (DE)    ........................ 10 2004 041 896

(51) Int. Cl.
*H03L 7/06*    (2006.01)
(52) U.S. Cl. ...................................... 327/158
(58) Field of Classification Search ................. 327/158
See application file for complete search history.

(56) References Cited

U.S. PATENT DOCUMENTS 5,973,525 A * 10/1999 Fujii ........................... 327/158

FOREIGN PATENT DOCUMENTS

| EP | 1093228 A1 | 4/2001 |
|---|---|---|
| EP | 1381053 A2 | 1/2004 |

\* cited by examiner

*Primary Examiner*—Tuan T Lam
*Assistant Examiner*—Daniel Rojas
(74) *Attorney, Agent, or Firm*—Slater & Matsil, L.L.P.

(57) ABSTRACT

The invention relates to a clock signal synchronizing method, and to a clock signal synchronizing device (101) to be used with the synchronization of clock signals (CLK, DQS), comprising:

- a delay means (102) with a variably controllable delay time ($t_{var}$), in which a clock signal (CLK) or a signal obtained therefrom is input, is loaded with the variably controllable delay time ($t_{var}$), and is output as delayed clock signal,
- a phase comparator (104) for comparing the phase of the clock signal (CLK) or of the signal obtained therefrom with the phase of the delayed clock signal or of a signal obtained therefrom (DCLK, FB),
- characterized in that additionally a means (401, 116) is provided for activating and/or deactivating said clock signal synchronizing device (101) as a function of control signals (RD) evaluated by an evaluating means (402).

23 Claims, 6 Drawing Sheets

CLOCK SIGNAL SYNCHRONIZING DEVICE, AND CLOCK SIGNAL SYNCHRONIZING METHOD

CLAIM FOR PRIORITY

This application claims the benefit of priority to German Application No. 10 2004 041 896.9 which was filed in the German language on Aug. 30, 2004 the contents of which are hereby incorporated by reference.

The invention relates to a clock signal synchronizing device, in particular for synchronizing a clock signal that is used internally in a memory chip with a clock signal that is input externally in the memory chip, as well as to a clock signal synchronizing method.

In semi-conductor devices, in particular in memory devices such as DRAMs (DRAM=Dynamic Random Access Memory and/or dynamic read/write memory) based on CMOS technology, so-called clock signals are used for the chronological co-ordination of the processing and/or relaying of the data.

Conventional semi-conductor devices in general use a single clock signal present on a single line (i.e. a so-called "single-ended" clock signal), for this purpose.

The data may then, for instance, be relayed at respective rising edges of the single-ended clock signal (or, alternatively, e.g. at respective falling edges of the single-ended clock signal).

Further, so-called DDR devices, in particular DDR-DRAMs (DDR-DRAM=Double Data Rate DRAM) are already well known.

In DDR devices—instead of one single clock signal present on a single line ("single ended" clock signal)—two differential, oppositely inverse clock signals present on two separate lines are used.

Every time, for instance, when the first of the two clock signals changes from a "logic high" state (e.g. a high voltage level) to a "logic low" state (e.g. a low voltage level), the second clock signal—substantially simultaneously—changes its state from "logic low" to "logic high" (e.g. from a low to a high voltage level).

Conversely, whenever the first clock signal changes from a "logic low" state (e.g. from a low voltage level) to a "logic high" state (e.g. a high voltage level), the second clock signal (again substantially simultaneously) changes its state from "logic high" to "logic low" (e.g. from a high to a low voltage level).

With DDR devices, the data are, in general, relayed both at the rising edge of the first clock signal and at the rising edge of the second clock signal (or both at the falling edge of the first clock signal and at the falling edge of the second clock signal, respectively).

This means that data are relayed more frequently and/or faster (in particular twice as frequently and/or twice as fast) with a DDR device than with corresponding, conventional devices using a "single ended" clock signal, i.e. the data rate is higher, in particular twice as high, as that of corresponding, conventional devices.

The clock signal ("DQS" or "data strobe" signal) used internally in the device for the chronological coordination of the processing and/or relaying of the data (or—when differential, oppositely inverse clock signals are used—the internal clock signal DQS and the clock signal BDQS that is oppositely inverse to the clock signal DQS) has to be synchronous to a clock signal ("CLK" or "clock" signal) input externally in the device (or synchronous to the differential clock signals CLK, BCLK input externally in the device, respectively).

The external clock signal(s) CLK, BCLK is (are) generated by an appropriate clock signal generator that is connected to the device.

For synchronizing the internally generated clock signal DQS or the internally generated clock signals DQS, BDQS, respectively, with the external clock signal(s) CLK, BCLK, a clock signal synchronizing device, e.g. a DLL circuit (DLL=Delay Locked Loop) is used. Such a circuit is, for instance, known form EP 964 517.

Figure 1:
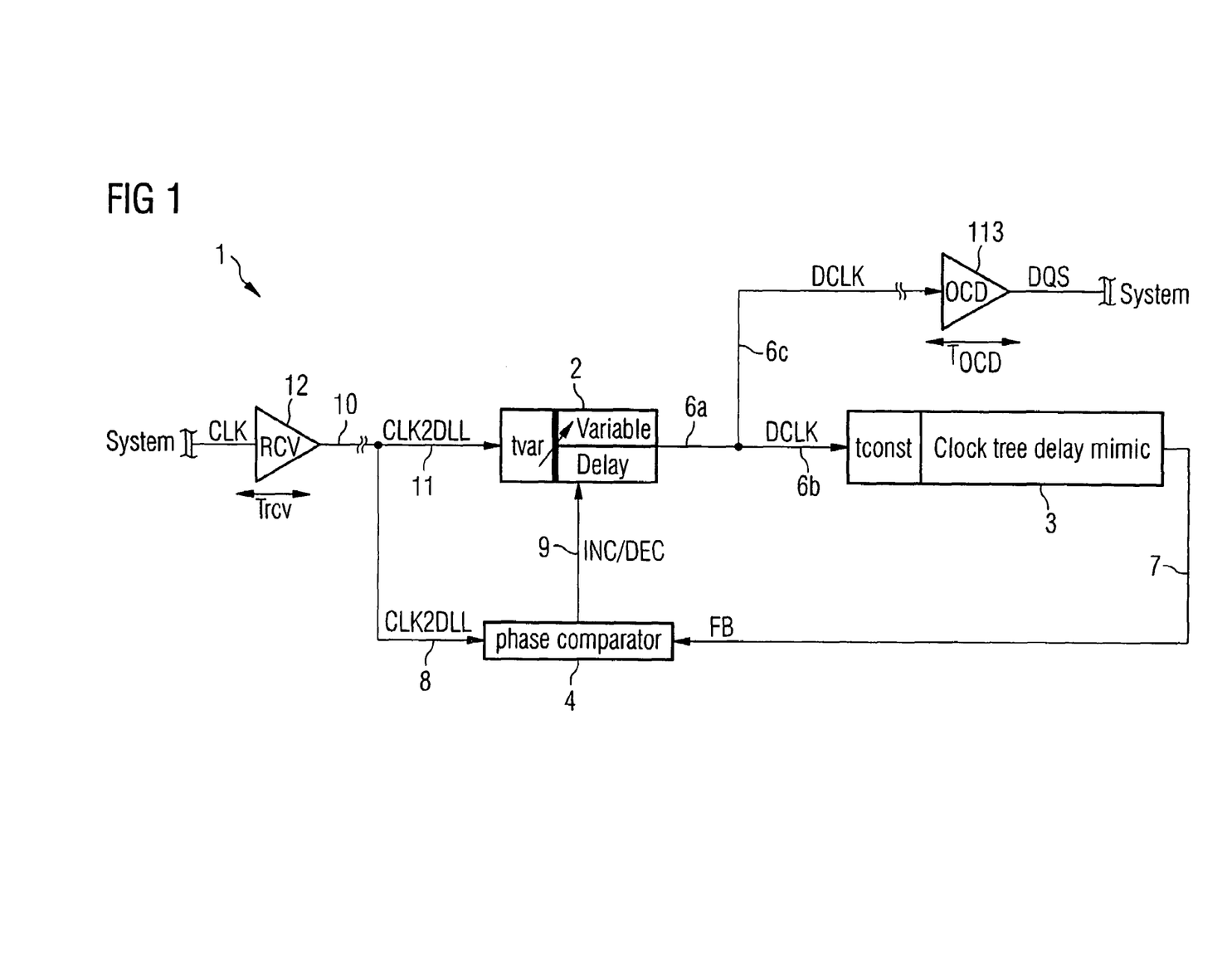
FIG. 1 a simplified, schematic representation of a clock signal synchronizing device according to prior art, which can, for instance, be used in a memory device.

A clock signal synchronizing device 1 may—as is illustrated in FIG. 1—e.g. comprise a first delay means 2, a second delay means 3, and a phase comparator 4.

External clock signals CLK, BCLK that are received by an appropriate receiver 12 and are output as correspondingly delayed clock signals CLK2DLL are—via appropriate lines 10, 11—input in the first delay means 2.

In the first delay means 2, the clock signal(s) CLK2DLL input (and delayed by the receiver 12) is (are)—as a function of a control signal INC, DEC output by the phase comparator 4—loaded with a variable delay time $t_{var}$ that is adjustable by the control signal.

The signal(s) DCLK (or BDCLK) output by the first delay means 2 at corresponding lines 6a, 6c may be used—internally—in the device for the chronological coordination of the processing and/or relaying of the data (i.e. as—internal—clock signal(s)).

The signal DCLK (or BDCLK) output by the first delay means 2 is fed—via a line 6b—to the second delay means 3 that loads the signal input with a—fixed—delay time $t_{const}$ that corresponds approximately to the signal delays caused by the receiver(s) 12 ("receiver delay" Trcv) and corresponding off-chip drivers 13 ("OCD delay" Tocd) (and—possibly additionally—the respective data path ("data path delay")).

The signal (FB signal or "feedback signal") output by the second delay means 3 is—via a line 7—fed to the above-mentioned phase comparator 4. There, the phasing of the FB signal is compared with the phasing of the CLK2DLL signal that is also input in the phase comparator 4 (via a line 8). Depending on whether the phase of the FB signal is faster or slower than that of the CLK2DLL signal, the phase comparator 4 outputs—as a control signal for the above-mentioned first delay means 2—an incrementing signal (INC signal) or a decrementing signal (DEC signal) via a line 9, said signals having the effect that the delay $t_{var}$ of the CLK or CLK2DLL signal, respectively, caused by the first signal delay means 2 is increased in the case of an INC signal and decreased in the case of a DEC signal, so that, finally, the CLK2DLL signal and the FB signal (and thus also the CLK signal and a DQS signal) are synchronized, i.e. the clock signal synchronizing device is "locked".

In the locked state of the clock signal synchronizing device 1, a filter means (not illustrated) connected between the phase comparator 4 and the first delay means 2 may be activated, said filter means transmitting the INC or DEC signal to the first signal delay means 2 only if the phase comparator 4 outputs one and the same signal for a particular number of successive clocks—e.g. defined by the clock signals CLK, BCLK—(e.g. 16 successive clocks) (e.g. an INC signal for 16 successive clocks, or a DEC signal for 16 successive clocks).

In the locked state of the clock signal synchronizing device 1, a re-synchronization of the clock signal DQS with respect to the clock signal CLK can be ensured from time to time (namely, when the INC or DEC signal is relayed to the first signal delay means by the filter means).

Figure 2:
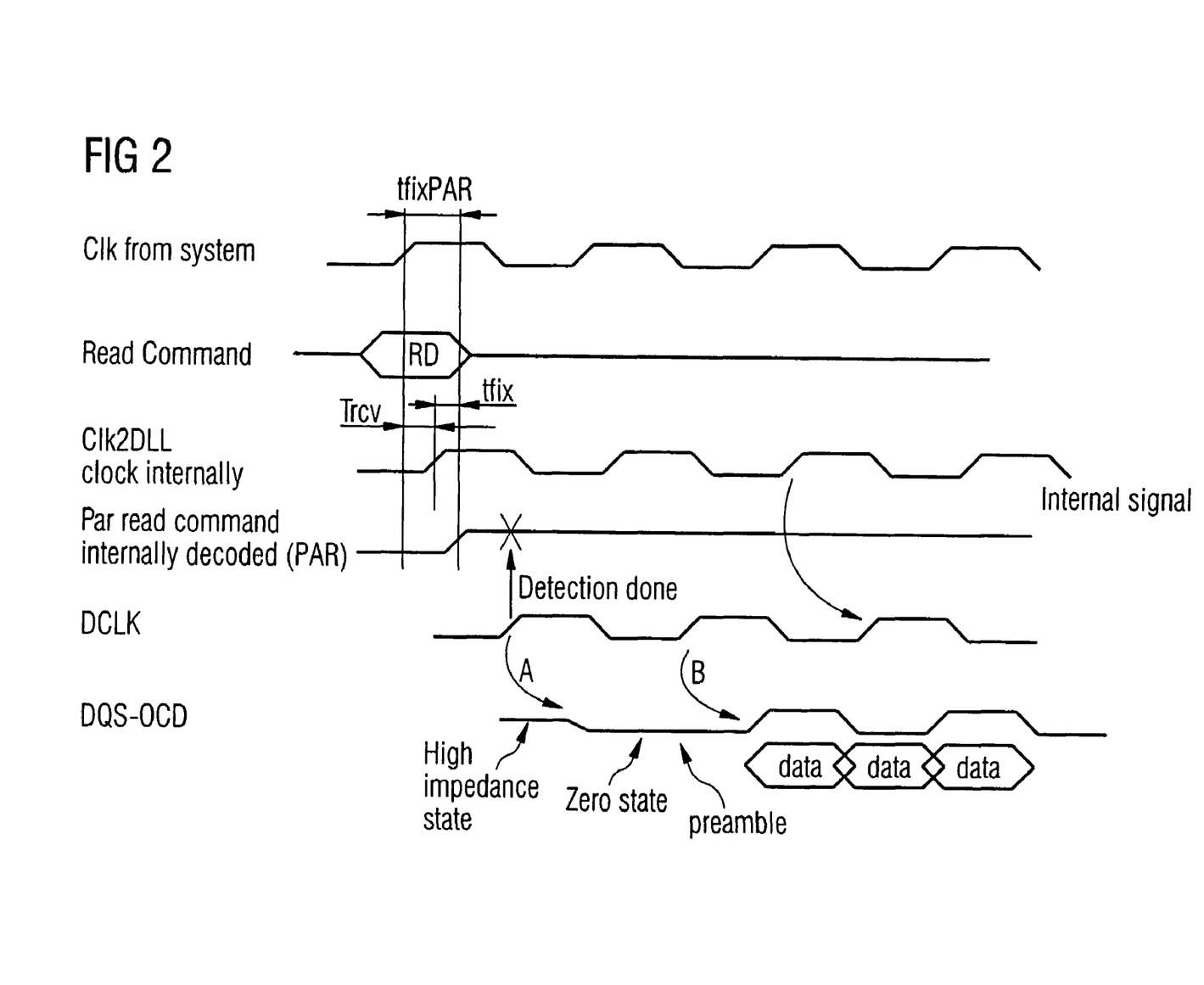
FIG. 2 time flow diagrams of signals occurring during the reading out of data from the memory device.

If the synchronizing device 1 is used in a memory device, and if corresponding data stored in the memory device are to be read out from this memory device, a corresponding, external read command signal RD may—as is illustrated in FIG. 2—be input in the memory device (namely e.g. such that it is—as is illustrated in FIG. 2—stably present at the corresponding memory device contact at respective (e.g. positive) edges of the CLK signal.

In reaction to this, a—latched—PAR signal (read command detecting signal or read command decoding signal, respectively) changes its state internally in the memory device, e.g. from "logic low" to "logic high" (or vice versa).

Between the above-mentioned (e.g. positive) edge of the CLK signal (to which the read command signal is stable) and the change of state (or the corresponding positive edge, respectively) of the PAR signal (read command detecting signal or read command decoding signal, respectively), there elapses a—total—delay time tfixPAR (total read command signal decoding delay time).

The total read command signal decoding delay time (tfixPAR) may divided into a delay of the signals input in the memory device caused i.a. by the above-mentioned receiver 12 (in particular of the clock signal CLK (cf. the above-mentioned delayed clock signal CLK2DLL) ("receiver delay" or receiver delay time Trcv)), and a time needed internally in the memory device for decoding the read command signal (internal decoding delay time tfix), wherein there applies: tfixPAR=Trcv+tfix.

The detection of whether a change of state has taken place with the PAR signal (which means that a read command signal has been input in the memory device) is performed with respect to the above-mentioned clock signal DCLK output by the first delay means 2. If the PAR signal is—at a corresponding (e.g. positive) edge of the DCLK signal—"logic high" (i.e. has changed its stated as explained above), it is initiated—in correspondence with the Arrow A illustrated in FIG. 2—that the DQS signal output by the off-chip driver 13 (which is, after the taking into operation of the clock signal synchronizing device 1 first of all e.g. in a state of high impedance) changes its state (e.g. to "logic low"—so-called "Zero state" in a "preamble phase" of the clock signal synchronizing device 1).

The preamble phase lasts for one clock period. From the corresponding, next (e.g. positive) edge of the DCLK signal on, it is initiated—in correspondence with Arrow B illustrated in FIG. 2—that the DCLK signal that has already been synchronized is correspondingly connected through to the above-mentioned off-chip drivers 13, so that they output a clock signal DQS that is synchronized with the CLK signal.

The preamble phase serves to indicate to the respective Controller that controls the memory device that the corresponding data read out from the memory device are output at the next, appropriate (e.g. positive) edge of the DQS signal.

The above-mentioned clock signal synchronizing device 1 is—e.g. to ensure that the PAR signal can be latched correctly—constantly kept in an active or switched-on state, i.e. the clock signal synchronizing device 1 is in operation even if it is actually not needed at all. This leads to undesired, relatively high electric power consumption—in particular when the clock signal synchronizing device 1 or the memory device, respectively, is used in mobile terminal equipment, e.g. mobile phones. Therefore, memory devices for mobile terminal equipment are often used without clock synchronization, this making it impossible to use them at higher operating frequencies.

It is therefore an object of the invention to provide a novel clock signal synchronizing device, and a novel clock signal synchronizing method, in particular a device and a method with which it is possible to at least partially eliminate the above-described drawbacks.

This and other objects of the invention are achieved by the subject matters of claims 1 and 10.

Advantageous further developments of the invention are indicated in the subclaims.

In accordance with a basic idea of the invention, there is provided a clock signal synchronizing device for use with the synchronization of clock signals (CLK, DQS), comprising:

a delay means with a variably controllable delay time ($t_{var}$) in which a clock signal or a signal obtained therefrom is input, loaded with the variably controllable delay time ($t_{var}$), and output as a delayed clock signal, a phase comparator for comparing the phase of the clock signal or of the signal obtained therefrom with the phase of the delayed clock signal or a signal obtained therefrom, characterized in that there is additionally provided a means for activating and/or deactivating the clock signal synchronizing device as a function of control signals evaluated by evaluating means.

Thus, it may be ensured that the clock signal synchronizing device is activated only if it is really needed (in particular if the above-mentioned evaluating means detects that corresponding control signals, e.g. read command signals, etc. are present at the clock signal synchronizing device or at a device controlled by it).

By that, the electric power consumption can distinctly be Decreased vis-à-vis conventional clock signal synchronizing devices.

Figure 3:
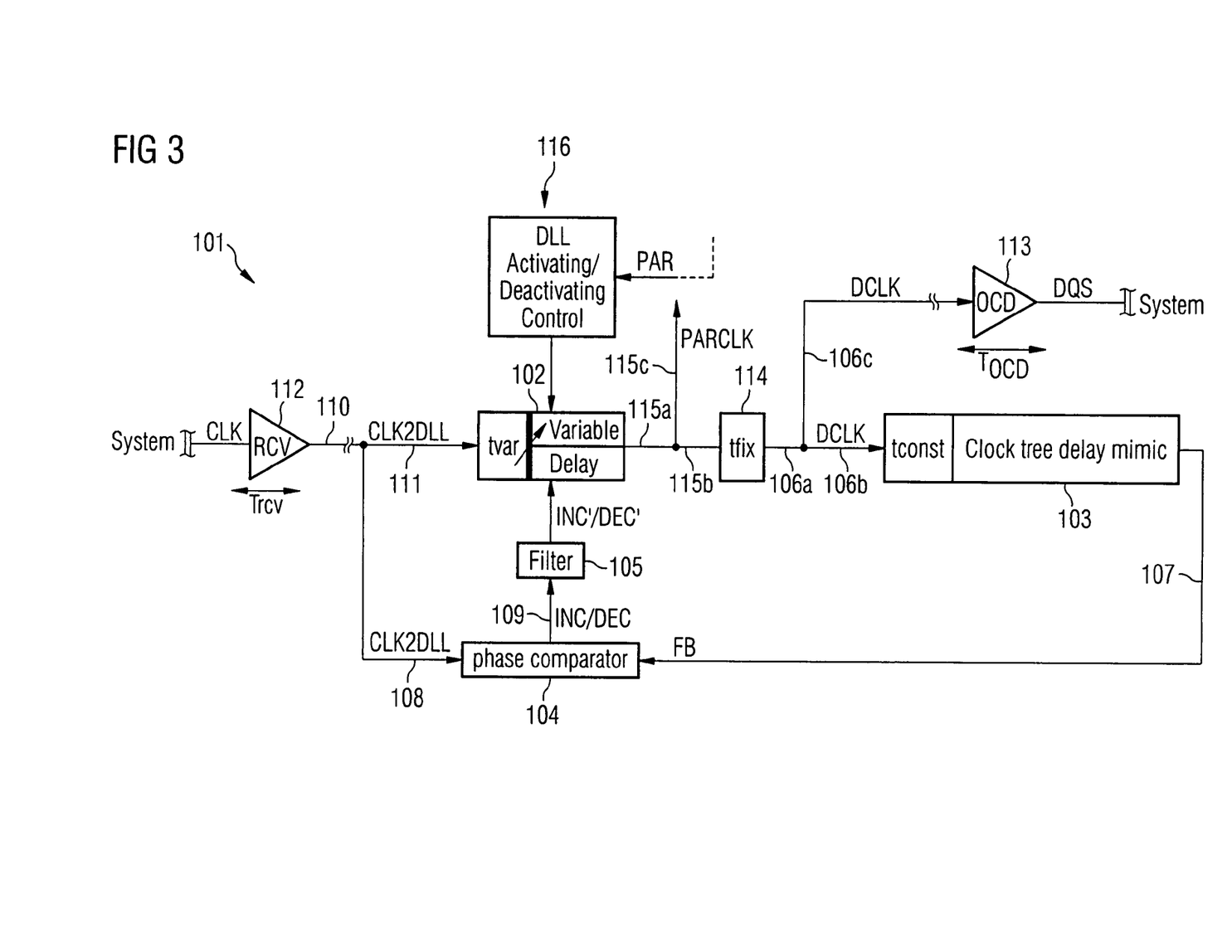
FIG. 3 a simplified, schematic representation of a clock signal synchronizing device according to an embodiment of the invention, which can, for instance, be used in a memory device.

In the following, the invention will be explained in more Detail by means of embodiments and the enclosed drawing. The drawing shows:

FIG. 3 shows a schematic representation of a clock signal synchronizing device 101 according to an embodiment of the invention.

It comprises—correspondingly similar to conventional clock signal synchronizing devices, in particular the clock signal synchronizing device 1 illustrated in FIG. 1—a first delay means 102, a second delay means 103, a phase comparator 104, and (optionally) a filter means 105 connected between the phase comparator 104 and the first delay means 102 (and operates correspondingly similar or identical to conventional clock signal synchronizing devices), except that—other than with conventional clock signal synchronizing devices, and as will be explained in more detail in the following—a specifically designed, additional delay means 114 is connected between the first delay means 102 and the second delay means 103, and that an additional clock signal PARCLK that is used in a specific way that will be explained in more detail in the following is tapped between the first delay means 102 and the additional delay means 114, and that a control means 116 used for activating/deactivating the clock signal synchronizing device 101 may be provided.

The clock signal synchronizing device 101 may, for instance, be provided on a semiconductor device (chip), in particular a memory device, e.g. a ROM device (ROM=Read Only Memory), or a RAM device (RAM=Random Access Memory or read-write memory, respectively), in particular a DRAM (DRAM=Dynamic Random Access Memory or dynamic read-write memory, respectively) based e.g. on CMOS technology, e.g. a DDR-DRAM (DDR-DRAM=Double Data Rate DRAM), or a SRAM, etc., etc.

As results from FIG. 3, in the case of the clock signal synchronizing device 101, external clock signals CLK, BCLK received by a corresponding receiver 112 and output by it as correspondingly delayed clock signals CLK2DLL are—via corresponding lines 110, 111—input in the first delay means 102.

The external clock signal(s) CLK, BCLK is (are) e.g. Generated by a corresponding, external clock signal generator that is connected with the device, in particular the memory device.

In the first delay means 102, the input clock signal(s) CLK2DLL (delayed by the receiver 112) is (are) loaded with a variable delay time $t_{var}$ that is adjustable by the control signal—depending on a control signal INC, DEC output by the phase comparator 104 (and possibly filtered by the filter means 105).

The signal(s) PARCLK output by the first delay means 102 at corresponding lines 115a, 115b, 115c is (are) relayed to the above-mentioned additional delay means 114 that loads the signal PARCLK with a—fixed—delay time tfix.

This corresponds to the internal decoding delay time tfix Defined in connection with FIG. 2 (or—in other words—the total read command signal decoding delay time (tfixPAR) explained in connection with FIG. 2, minus the receiver delay time Trcv also explained in connection with FIG. 2, i.e. tfix=tfixPAR−Trcv).

The signal DCLK (or BDCLK) output by the above-mentioned Additional delay means 114 is—via corresponding lines 106a, 106b—fed to the second delay means 3 that loads the input signal with a—fixed—delay time $t_{const}$ that corresponds approximately to the sum of the signal delays caused by the receiver(s) 112 ("receiver delay" Trcv) and corresponding off-chip drivers 113 ("OCD delay" Tocd) (and—possibly additionally—the respective data path ("data path delay")).

The above-mentioned signal(s) DCLK (or BDCLK, respectively) output by the additional delay means 114 may be used internally in the device for the chronological coordination of the processing and/or relaying of the data (i.e. as—internal—clock signals(s)).

As results further from FIG. 3, the signal (FB signal or "feedback signal") output by the second delay means 103 is—via a line 107—fed to the above-mentioned phase comparator 104. There, the phasing of the FB signal is compared to that of the CLK2DLL signal that has also been input in the phase comparator 104 (via a line 108). Depending on whether the phase of the FB signal is faster or slower than that of the CLK2DLL signal, the phase comparator 104 outputs—as a Control signal for the above-mentioned first delay means 102—an incrementing signal (INC signal) or a decrementing signal (DEC signal) via a line 109, said signals resulting in that the delay $t_{var}$ of the CLK or CLK2DLL signal caused by the first signal delay means 102 is increased with an INC signal or reduced with a DEC signal, so that, finally, the CLK2DLL signal and the FB signal are synchronized, i.e. the clock signal synchronizing device 101 is "locked".

In this case—correspondingly similar to the clock signal synchronizing device 1 illustrated in FIG. 1—the CLK and a corresponding DQS signal are also synchronized with each other since—vis-à-vis the clock signal synchronizing device 1 illustrated in FIG. 1—the signal CLK2DLL is indeed Compared with a signal FB that has been delayed "too much" (by the above-mentioned delay time tfix by the additional delay means 114), and the first delay means 102 thus outputs—in the locked state of the clock signal synchronizing device 101—a signal PARCLK that has been delayed "too little" (by the above-mentioned delay time tfix) vis-à-vis the signal DCLK output by the first delay means 2 illustrated in FIG. 1, but this signal is delayed by the additional delay means 114 by exactly this delay time tfix.

In the locked state of the clock signal synchronizing device 101, the above-mentioned filter means 105—connected between the phase comparator 104 and the first delay means 102—may be activated, which relays the INC or DEC signal to the first signal delay means 102 only if one and the same signal is output by the phase comparator 104 for a particular number of successive clocks—e.g. defined by the clock signals CLK, BCLK (e.g. 16 successive clocks) (e.g. an INC signal for 16 successive clocks, or a DEC signal for 16 successive clocks).

Thus—in the locked state of the clock signal synchronizing device 101—a re-synchronization of the clock signal DQS with respect to the clock signal CLK can be ensured from time to time (namely, when the INC or DEC signal is relayed by the filter means to the first signal delay means).

If the synchronizing device 101 is used in a memory device, and if corresponding data stored in the memory device are to be read out therefrom, a corresponding, external read command signal RD may be input in the memory device—correspondingly similar as is shown in FIG. 2 (and correspondingly similar as explained in connection with the clock signal synchronizing device 1 illustrated in FIG. 1) (namely e.g. such that it is—as illustrated in FIG. 2—stably present at the corresponding memory device contact at respective (e.g. positive) edges of the CLK signal).

In reaction to this—correspondingly similar as illustrated in FIG. 2 (and correspondingly similar as explained in connection with the clock signal synchronizing device 1 illustrated in FIG. 1) a—latched—PAR signal (read command detection signal or read command decoding signal, respectively) changes it state—internally in the memory device—e.g. from "logic low" to "logic high" (or vice versa).

Other than conventional clock signal synchronizing devices, the clock signal synchronizing device 101 illustrated in FIG. 3 is not constantly kept in an active or switched on state, or an operating state, respectively. Instead, the clock signal synchronizing device 101—in particular the first delay means 102—is, after the taking into operation of the memory device, first of all in an inactive or switched off state, or in a state out of operation, respectively (in particular e.g. controlled by the control means 116 illustrated in FIG. 3). Thus, no signal is propagated through the first delay means 102, and the electric power consumption is minimized.

Only if the clock signal synchronizing device 101 is actually needed (i.e. in particular if a change of state has taken place with the PAR signal (which means that a read command signal has been input in the memory device) can the first delay means 102 be placed in an active or switched on state, or in an operating state, respectively—in particular controlled by the control means 116.

Later—e.g. after the termination of the read process, or after the synchronization has been performed (or after the clock signal synchronizing device 101 has been placed in a "locked state"), etc., the clock signal synchronizing device 101 or the above-mentioned parts thereof, respectively, may be returned to the above-mentioned inactive or switched off state, or the state out of operation, respectively.

As compared to conventional clock signal synchronizing devices, this renders it possible to decrease the electric power consumption, which is of advantage especially if the clock signal synchronizing device 101 or the memory device, respectively, is used in mobile end equipment, e.g. mobile phones, laptops, etc.

Figure 5:
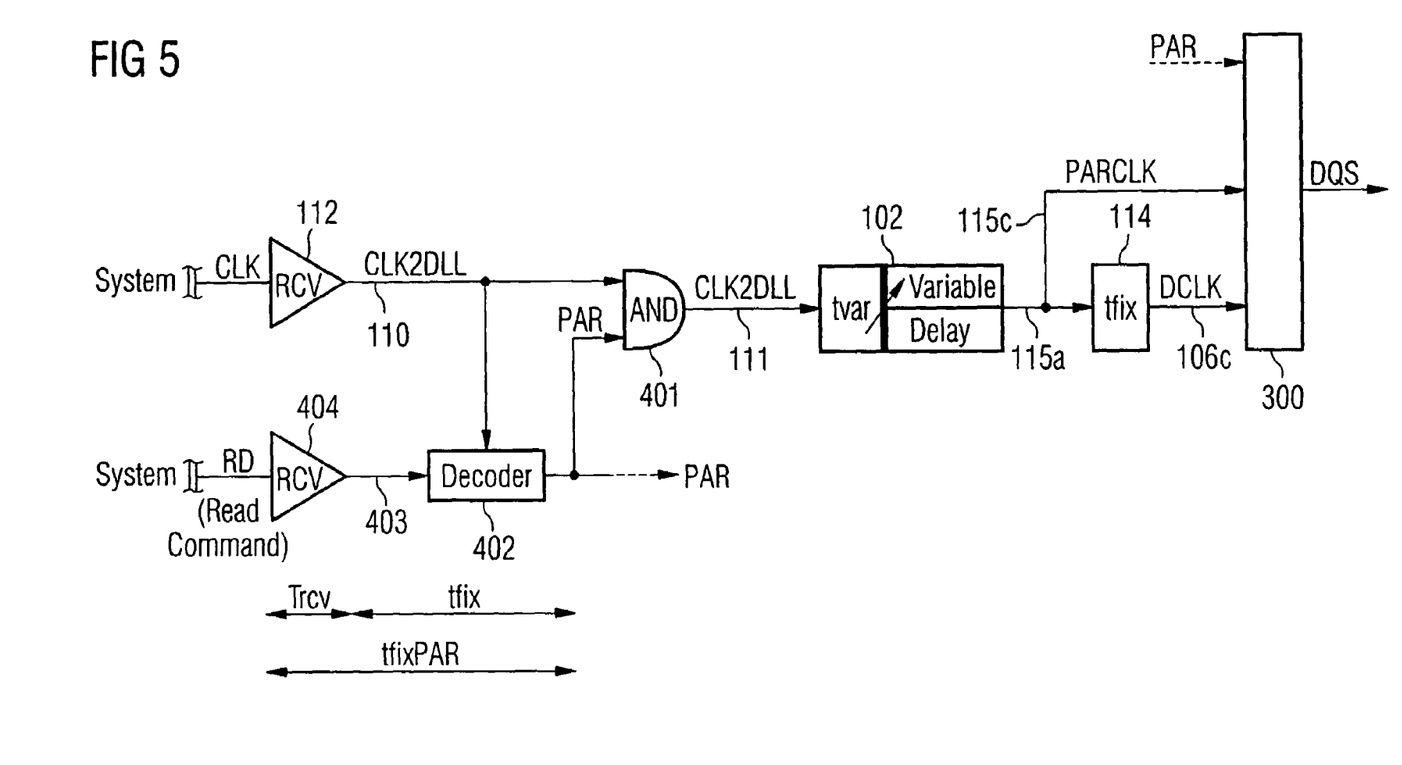
FIG. 5 a simplified, schematic representation of a circuit that is adapted to be used for controlling a DQS signal, making use of one of the clock signal synchronizing devices illustrated in FIG. 3 or 4 and illustrated only in part here.

As results from the above statements—and in particular from the circuit diagram illustrated in FIG. 5—the clock signal CLK (and signals derived therefrom) is/are propagated through the clock signal synchronizing device 101 (in particular the above-mentioned delay means 102, 114, 103) only after the activating/switching on of the clock signal synchronizing device 101.

For this purpose, the CLK2DLL signal present at a line 110 and output by the receiver 112 can (as is illustrated in FIG. 5) be applied at a first input of an AND gate 401, and the PAR signal output by a decoding means 402 can be applied at a second input of the AND gate.

Only if the decoding means 402 detects (at a corresponding, e.g. positive clock edge of the CLK2DLL signal) that the above-mentioned read command signal (RD signal) has been output by a further receiver 404 at a line 403 (and consequently the initially "logic low" PAR signal is set to "logic high" by the decoding means 402), is the CLK2DLL signal present at the line 110 relayed—via the AND gate 401—to the line 111 and thus to the (first) delay means 102.

Figure 6:
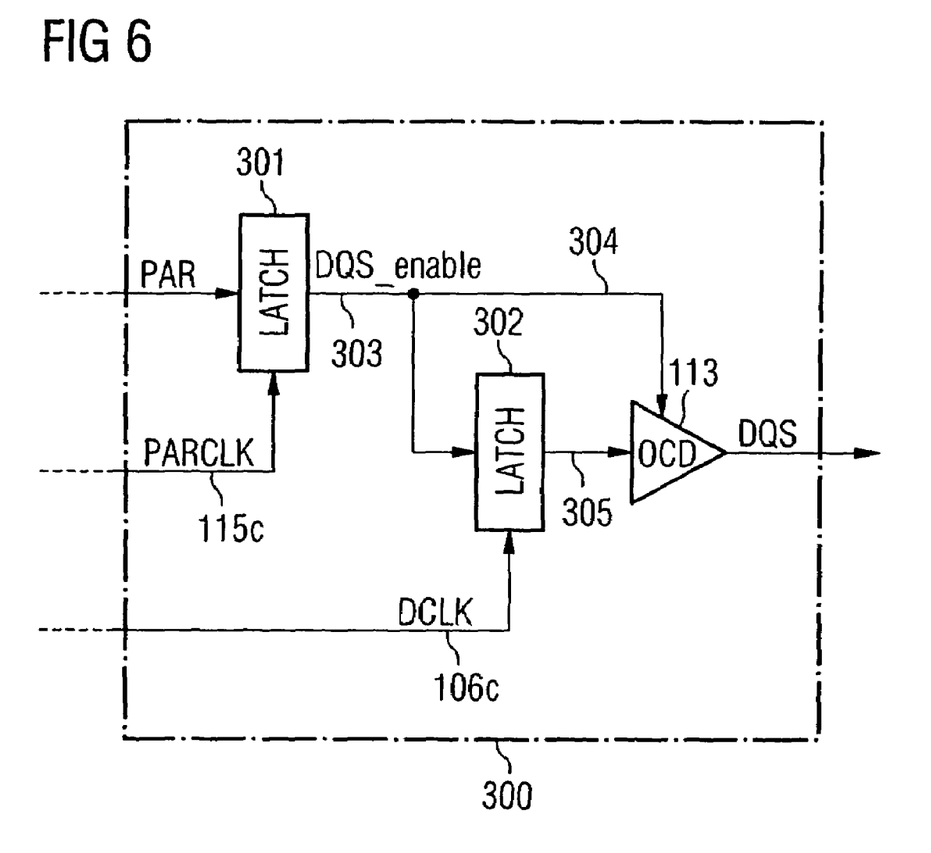
FIG. 6 a simplified, schematic detail representation of a section of the circuit illustrated in FIG. 5.

FIG. 6 is a simplified, schematic detail representation of a section 300 of the circuit illustrated in FIG. 5, in particular of the circuit section 300 that is used—directly—for controlling the DQS signal.

As has already been explained above, in the present Embodiment the clock signal synchronizing device 101 is only activated if a change of state has taken place with the PAR signal.

If, in the present embodiment—e.g. at a circuit section corresponding to the circuit section 300 illustrated in FIG. 6—the state of the PAR signal would—like in prior art—be evaluated at points in time that are defined by corresponding (e.g. positive) edges of the DCLK signal, the Detection that a change of state has taken place with the PAR signal would be performed too late by the above-mentioned delay time duration tfix.

In order to prevent this, in the clock signal synchronizing device 101 illustrated in FIG. 3 and at the above-mentioned circuit section 300—instead of the clock signal DCLK—the clock signal PARCLK that is additionally tapped between the first delay means 102 and the additional delay means 114 and that is output at the line 115c is used for the above-mentioned purpose (said clock signal PARCLK being faster vis-à-vis the clock signal DCLK by the above-mentioned delay time duration tfix).

The detection of whether a change of state has taken place with the PAR signal (which means that a read command signal has been input in the memory device) is thus performed in the present embodiment with respect to the above-mentioned clock signal PARCLK that is output between the first and the additional delay means 102, 114. If the PAR signal is—at a corresponding (e.g. positive) edge of the PARCLK signal—"logic high" (i.e. has changed its state as described above), it is initiated—correspondingly similar as with the clock signal synchronizing device 1 illustrated in FIG. 1 (and as explained above with respect to FIG. 2) that the DQS signal output by the off-chip driver 113 (which is, after the taking into operation of the memory device, first of all e.g. in a state of high impedance) changes its state (e.g. to "logic low"—so-called "Zero state" in a "preamble phase" of the clock signal synchronizing device 101).

This may, for instance, be achieved in that—as is Illustrated in FIG. 6—the PAR signal that changes its state e.g. to "logic high" on detection of a read command signal is input in a data input of a latch 301, and is, at the next (in particular positive) edge of the PARCLK signal input in a control input of the latch 301, correspondingly latched through the latch 301, this causing a DQS enable signal (DQS_enable) that is output at a line 303 that is connected with the output of the latch 301 to change its state—also—to "logic high", and the off-chip driver 113 to be activated (by a "logic high" signal that is present at a line 304 that is connected with the line 303 and an enable input of the off-chip driver 113).

The preamble phase lasts—approximately—one clock period. From the corresponding, next (e.g. positive) edge of the DCLK signal on, it is—correspondingly similar to the clock signal synchronizing device 1 illustrated in FIG. 1 (and as explained above with respect to FIG. 2)—initiated that the DCLK signal—which is already synchronized then—is correspondingly connected through to the above-mentioned off-chip driver 113, so that it outputs a clock signal DQS that is synchronized with the CLK signal.

This may, for instance, be achieved in that—as is Illustrated in FIG. 6—the above-mentioned DQS_enable signal that is output at the line 303 is input in the data input of a latch 302 and is, at the next (in particular positive) edge of the DCLK signal input in a control input of the latch 302, correspondingly latched through the latch 302, this causing a signal output at a line 305 that is connected with the output of the latch 302 to change its state (in correspondence with the control by the DCLK signal) first of all—corresponding to the signal DCLK—e.g. from "logic low" to "logic high" (whereby the signal DQS output by the off-chip driver 113 also changes its state from "logic low" to "logic high"), and then—again corresponding to the signal DCLK—back from "logic high" to "logic low", etc., etc. (whereby, again, the signal DQS output by the off-chip driver 113 also changes its state back from "logic high" to "logic low", etc., etc.)).

As has already been explained above, the preamble phase serves to indicate to the respective controller that controls the memory device that, at the next, corresponding (e.g. positive) edge of the DQS signal, the corresponding data read out of the memory device are output.

Figure 4:
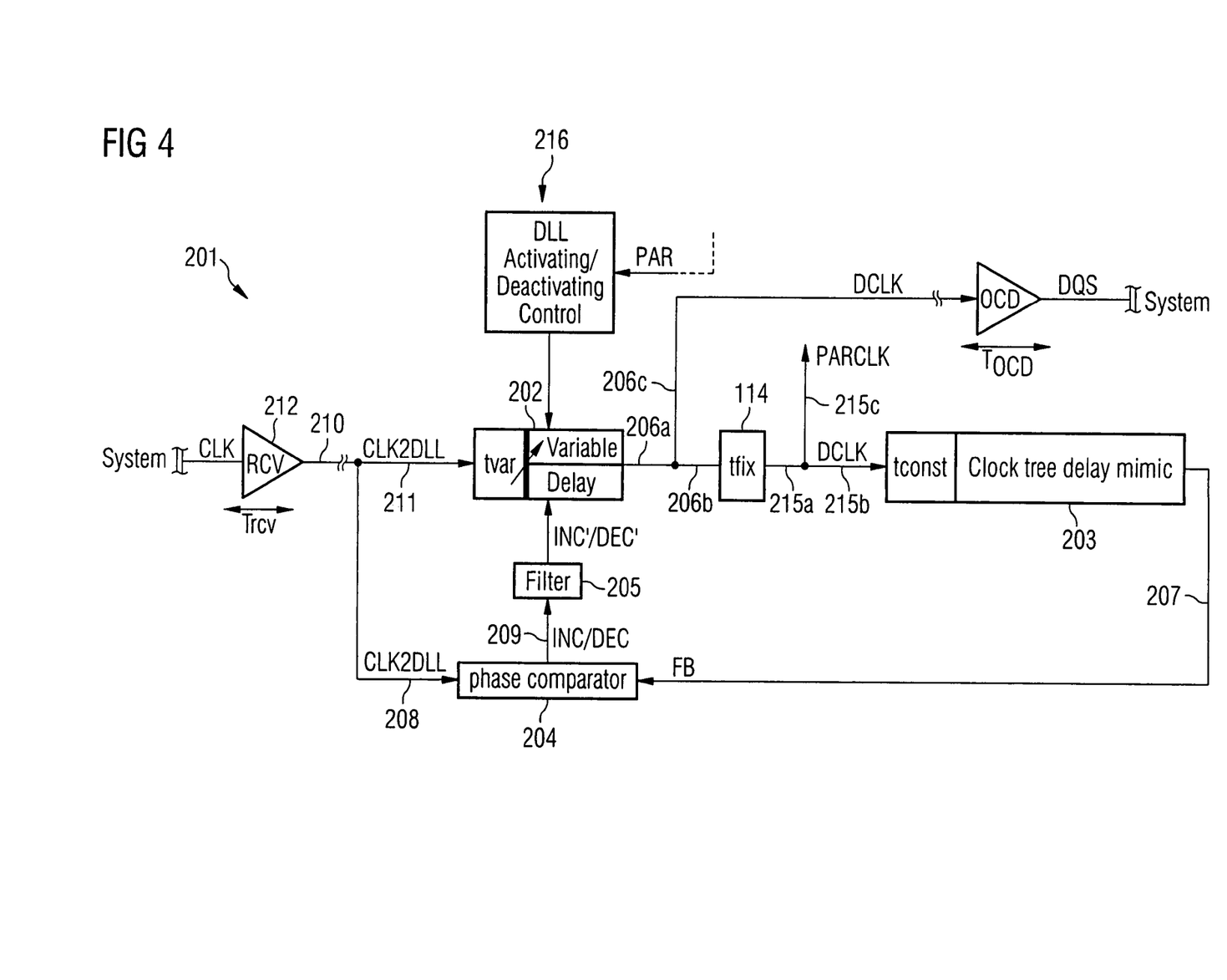
FIG. 4 a simplified, schematic representation of a clock signal synchronizing device according to a further embodiment of the invention, which can, for instance, be used in a memory device.

FIG. 4 shows a schematic representation of a clock signal synchronizing device 201 according to an alternative, further embodiment of the invention.

It comprises—correspondingly similar to the clock signal synchronizing device 101—a first delay means 202, a second delay means 203, a phase comparator 204, and an additional delay means 214, as well as—optionally—a filter means 105 (and works correspondingly similar or identical to the clock signal synchronizing device 101 illustrated in FIG. 3), except that—as will be explained in more detail in the following—the signal input in the additional delay means 214 and the signal output by the additional delay means 214 (signals DCLK, PARCLK) are used correspondingly conversely to the clock signal synchronizing device 101 illustrated in FIG. 3 (namely, the signal input in the additional delay means 214 as "DCLK" signal (corresponding to the DCLK signal output by the additional delay means 114 in accordance with FIG. 1) and the signal output by the additional delay means 214 as "PARCLK" signal (corresponding to the PARCLK signal input in the additional delay means 114 in accordance with FIG. 1)).

The clock signal synchronizing device 201 illustrated in FIG. 4 may be used for the—rare—case that tfix=tfixPAR−Trcv is negative, i.e. if the total read command signal decoding delay time (tfixPAR) defined in connection with FIG. 2 is smaller than the receiver delay time Trcv also explained in connection with FIG. 2 (in particular for the clock signal CLK input in the clock signal synchronizing device 201).

This may, for instance, be the case if, for the receiving of the read command signal, a different kind of (in particular a substantially faster) receiver is used than for the receiving of the clock signal CLK, so that—even before the corresponding, delayed clock signal CLK2DLL was relayed by the corresponding (slower) receiver—the read command signal is relayed by the above-mentioned receiver to the corresponding decoding means and is decoded by it, etc.

Instead of the additional delay means 114 with negative (not realizable) delay time −|tfix| which would then—in fact—be required with a clock signal synchronizing device 101 according to FIG. 3, the—alternative—structure illustrated in FIG. 4 may then be used (with a delay means 214 with a—positive—delay time of |tfix|=|tfixPAR−Trcv|).

The invention claimed is:

1. A clock signal synchronizing device to be used with a synchronization of clock signals, comprising:
a first delay means with a variably controllable delay time, in which a clock signal or a signal obtained therefrom is input, is loaded with the variably controllable delay time, and is output as a delayed clock signal;
a second delay means with a first constant delay time, the first constant delay time chosen based on a delay caused during evaluation of control signals by an evaluating means; and
a phase comparator for comparing a phase of the clock signal or of the signal obtained therefrom with a phase of the delayed clock signal or of a signal obtained therefrom,
wherein additionally a means is provided for activating and/or deactivating said clock signal synchronizing device as a function of the control signals evaluated by the evaluating means.

2. The clock signal synchronizing device according to claim 1, said device being provided on a memory device.

3. The clock signal synchronizing device according to claim 2, wherein said control signals are read control signals input in the memory device.

4. The clock signal synchronizing device according to claim 1, further comprising a third delay means with a second constant delay time.

5. The clock signal synchronizing device according to claim 4, wherein said second constant delay time is chosen based on signal delays caused by a receiver and/or an off-chip driver.

6. The clock signal synchronizing device according to claim 1, wherein, in addition to the delayed clock signal output by said first delay means or the signal obtained therefrom and a signal output by said second delay means or a signal obtained therefrom, are used for generating a synchronized signal output by said clock signal synchronizing device.

7. The clock signal synchronizing device according to claim 1, wherein said device is provided in mobile end equipment comprising a mobile phone or a laptop.

8. A clock signal synchronizing method using the clock signal synchronizing device according to claim 1, said method comprising loading a clock signal or a signal obtained therefrom with a variably controllable delay time, so that a delayed clock signal is obtained, wherein the loading is only performed if it is detected that a corresponding control signal is present at an input of said clock signal synchronizing device, or at an input of a device for which said clock signal synchronizing device is used.

9. A clock signal synchronizing device comprising:
a first delay element coupled to a clock input the first delay element comprising a controllable variable delay time;
a second delay element coupled to the first delay element, the second delay element comprising a first constant delay time, wherein
the first constant delay time is chosen based on a delay caused during evaluation of control signals, and
the first constant delay time corresponds to a memory read command signal decoding delay time;
a phase comparator coupled to an output of the second delay element and to a clock input, wherein the phase comparator compares a phase of the clock input with a phase of a clock output of the second delay element; and
a control element coupled to the control signals, wherein the control element is operable to activate or deactivate the clock signal synchronizing device.

10. The clock signal synchronizing device according to claim 9, wherein the clock signal synchronizing device provides a clock for a memory device.

11. The clock signal synchronizing device according to claim 10, wherein the control signals comprise read control signals input to the memory device.

12. The clock signal synchronizing device according to claim 9, further comprising a third delay element coupled between the second delay element and the phase comparator, the third delay element comprising a second constant delay time.

13. The clock signal synchronizing device according to claim 12, wherein the second constant delay dyne is chosen based on signal delays caused by a receiver and/or an off-chip driver.

14. The clock signal synchronizing device according to claim 9, further comprising:
a first signal output coupled to a clock output of the first delay element;
a second signal output coupled to the clock output oldie second delay element; and
a synchronized signal generator, the synchronized signal generator comprising a synchronized signal output derived from the clock output of the first delay element and the clock output of the second delay element.

15. The clock signal synchronizing device according to claim 14, wherein the synchronized signal generator further comprises:
a first latch device clocked by the clock output of the second delay element; and
a second latch device clocked by the clock output of the first delay element wherein an output of the second latch device is coupled to an input of the first latch device, and wherein an output of the first latch device forms the synchronized signal output.

16. The clock signal synchronizing device according to claim 15, wherein an input of the second latch device comprises a signal activated by an external read command signal.

17. A mobile phone or laptop comprising the clock signal synchronizing device according to claim 9.

18. A method of using the clock signal synchronizing device according to claim 9, the method comprising outputting a delayed clock signal if a corresponding read control signal is asserted at an input of the clock signal synchronizing device.

19. The method of using the clock signal synchronizing device according to claim 18, wherein the first constant delay time corresponds to a memory read command signal decoding delay time.

20. A circuit comprising:
- a variable delay element coupled to a clock input;
- a first constant delay element coupled to an output of the variable delay element, the first constant delay element comprising a delay time based on a decoding time of a read control signal;
- a second constant delay element coupled to an output of the first constant delay element, the second constant delay element comprising a delay time based on a clock tree propagation time;
- a phase comparator comprising
   - a first phase comparison input coupled to the clock input,
   - a second phase comparison input coupled to an output of the second constant delay element
   - a phase comparison output coupled to a delay control input of the variable delay element; and
- an activation control circuit coupled to an enabling input of the variable delay element.

21. The circuit of claim 20 further comprising a system clock output coupled to the output of the variable delay element.

22. The circuit of claim 20 further comprising a system clock output coupled to the output of the first delay element.

23. A clock signal synchronizing device comprising:
- a first delay element coupled to a clock input, the first delay element comprising a controllable variable delay time;
- a second delay element coupled to the first delay element, the second delay element comprising a first constant delay time, wherein
   the first constant delay time is chosen based on a delay caused during evaluation of control signals;
- a phase comparator coupled to an output of the second delay element and to a clock input, wherein the phase comparator compares a phase of the clock input with a phase of a clock output of the second delay element;
- a control element coupled to the control signals, wherein the control element is operable to activate or deactivate the clock signal synchronizing device;
- a first signal output coupled to a clock output of the first delay element;
- a second signal output coupled to the clock output of the second delay element; and
- a synchronized signal generator, the synchronized signal generator comprising
   synchronized signal output derived from the clock output of the first delay element and the clock output of the second delay element,
   a first latch device clocked by the clock output of the second delay element, and
   a second latch device clocked by the clock output of the first delay element, wherein an output of the second latch device is coupled to an input of the first latch device, and wherein an output of the first latch device forms the synchronized signal output.

* * * * *